(12) United States Patent
Kreissig et al.

(10) Patent No.: US 7,235,990 B1
(45) Date of Patent: Jun. 26, 2007

(54) PROBE STATION COMPRISING A BELLOWS WITH EMI SHIELDING CAPABILITIES

(75) Inventors: Stefan Kreissig, Venusberg (DE); Joerg Kiesewetter, Thiendorf OT Sacka (DE)

(73) Assignee: SUSS MicroTec Test Systems GmbH, Sacka (DE)

( * ) Notice: Subject to any disclaimer, the term of this patent is extended or adjusted under 35 U.S.C. 154(b) by 0 days.

(21) Appl. No.: 11/299,487

(22) Filed: Dec. 12, 2005

(51) Int. Cl.
*G01R 31/02* (2006.01)
(52) U.S. Cl. ............ 324/754; 324/758; 324/765
(58) Field of Classification Search ........ 324/754–758, 324/73.1, 158.1
See application file for complete search history.

(56) References Cited

U.S. PATENT DOCUMENTS

| | | | | |
|---|---|---|---|---|
| 3,126,484 | A * | 3/1964 | Meeder et al. ........... | 250/497.1 |
| 4,115,736 | A * | 9/1978 | Tracy ..................... | 324/760 |
| 5,559,328 | A * | 9/1996 | Weiss et al. ............. | 250/306 |
| 5,835,997 | A * | 11/1998 | Yassine ................. | 324/754 |
| 5,963,027 | A * | 10/1999 | Peters ................... | 324/158.1 |
| 6,194,907 | B1 * | 2/2001 | Kanao et al. ............ | 324/760 |
| 6,335,627 | B1 * | 1/2002 | Gospe ................... | 324/754 |
| 6,424,141 | B1 * | 7/2002 | Hollman et al. ......... | 324/158.1 |
| 6,492,822 | B2 | 12/2002 | Schwindt et al. ....... | 324/754 |
| 2003/0038622 | A1 | 2/2003 | Peters et al. ........... | 324/158.1 |
| 2005/0218887 | A1 * | 10/2005 | Twerdochlib .......... | 324/207.16 |

* cited by examiner

*Primary Examiner*—Ha Tran Nguyen
*Assistant Examiner*—Arleen M. Vazquez
(74) *Attorney, Agent, or Firm*—Heslin Rothenberg Farley & Mesiti P.C.

(57) ABSTRACT

A probe station allows for effective EMI shielding of the passage of the probe through the wall of the housing of such probe station. The probe is freely movable in the X, Y and Z directions. The probe station comprises a housing having at least one aperture through which a probe can extend, a chuck for supporting a test device, the chuck being arranged inside the housing, at least one probe support for supporting a probe, the probe support being arranged relative to the housing such that a first portion of the probe extends into the housing through one of said apertures, at least one positioning mechanism enabling at least one of said probe and said chuck to move relative to the other, and is characterized in that at least one electrically conductive, elastic bellows is attached to the edge of an aperture which provides a variable passage for the probe.

18 Claims, 1 Drawing Sheet

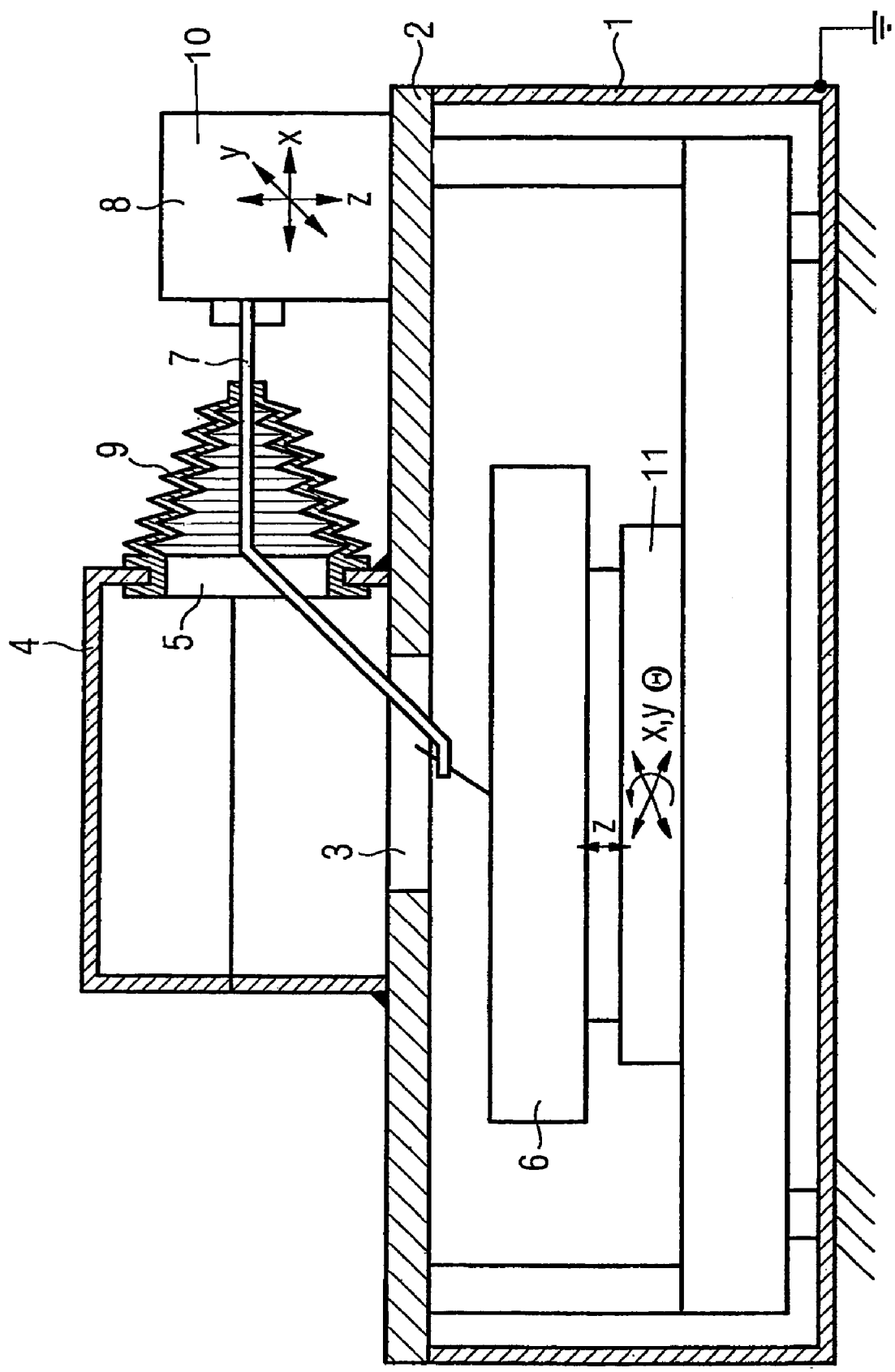

PROBE STATION COMPRISING A BELLOWS WITH EMI SHIELDING CAPABILITIES

BACKGROUND OF THE INVENTION

The present invention relates to a probe station adapted for low current and low voltage measurements in testing semiconductor wafers or other electronic devices. More particularly, the invention relates to a probe station with EMI shielding capabilities.

EMI, as used herein, means electromagnetic interference, while EMC means electromagnetic compatibility, i.e. a state of a device wherein the device is neither a source of nor influenced by EMI.

Such probe stations, as described for example in U.S. Pat. No. 6,492,822 to Cascade Microtech, Inc., usually comprise a housing wherein a chuck for supporting a substrate, e.g. a semiconductor wafer, is installed. The chuck may be fixed relative to the housing or be supported movably by means of a first positioning mechanism.

The housing has at least one aperture through which a first portion of the probe or probes extend in order to make contact to the substrate for testing purposes such that a first portion of the probe projects into the housing of the probe station. The probe itself is supported by a probe support which is arranged near the housing such that a second portion of the probe remains outside the housing of the probe station. The probe support may be fixed relative to the housing or be supported movably by means of a second positioning mechanism. Thus, either the chuck or the probe or both may be movable relative to the housing in the X and/or Y and/or Z directions. Additionally, the chuck or the probe or both may be rotatable relative to the housing about an axis, i.e. have a rotational degree of freedom.

In an alternative design of probe stations known in the art, the housing comprises a cap or a similar covering structure with EMI shielding properties which covers an opening in a top wall of the housing. In this case, the probe support is arranged near the covering structure of the housing and the apertures through which the probe or probes extend are provided in the covering structure.

The aperture or apertures are surrounded by an elastic gasket which can be made, for instance, of resilient foam. The foam must be electrically conductive for the gasket to have EMI shielding properties. In U.S. Pat. No. 6,492,822, the gasket is a sheet of such foam with a vertical slit which is self-closing, thus purportedly surrounding the probe snugly when it is inserted.

However, it has been found that, due to the lateral spreading of the slit by the probe permeating it, slot antennas which jeopardize effective EMI shielding may form around the probe. Moreover, movements of the probe in the X and Y directions are prevented while movements in the Z direction, i.e. vertical movements, are at least impeded due to the friction between the slit and the probe.

In US 2003/0038622 A1 (Peters et al.), a probe station is disclosed wherein the environment, i.e. the surrounding area, of the chuck is shielded from EMI by means of an electrically conductive flexible wall assembly containing flexibly extensible and retractable pleated wall elements. The wall elements are arranged in a manner which allows for a free movement of the chuck in X and Y directions. The assembly is mechanically complex and, therefore, expensive. Furthermore, the proposed solution holds a danger of slot antennas forming in the proximity of the edges of the wall elements.

It is, therefore, an object of the present invention to describe a probe station which overcomes the above mentioned drawbacks of the prior art. In particular, it is an object of the invention to provide a probe station which allows for effective EMI shielding of the passage between the probe support and the housing of such probe station through which the probe extends. It is another object of the invention to provide a probe station wherein the probe is entirely encapsulated in EMI shielding structures in order to improve the electromagnetic compatibility of the probe station. It is yet another object of the invention to disclose a probe station wherein the probe is freely movable in the X, Y and Z directions.

SUMMARY OF THE INVENTION

The present invention solves the problems mentioned above by providing a probe station which comprises a housing having at least one aperture through which a probe can extend, a chuck for supporting a test device, the chuck being arranged inside the housing, at least one probe support for supporting a probe, the probe support being arranged relative to the housing such that a first portion of the probe extends into the housing through one of said apertures, at least one positioning mechanism enabling at least one of said probe and said chuck to move relative to the other, and is characterized in that at least one electrically conductive, elastic bellows is attached to the edge of an aperture which provides a variable passage for the probe.

An elastic bellows, as used herein, shall mean a one-piece elastic member which is shaped so as to be attachable to the edge of an aperture and is deformable in such a way as to alter its length and/or direction and which provides a variable passageway for an elongate item such as a probe, thus allowing for spatial displacement of said elongate item.

The elastic bellows may constitute a closed passageway between the probe support and the aperture of the housing which is arranged so as to create a channel which encloses the second portion of the probe (i.e., the portion which remains outside the housing) entirely and shields this portion of the probe from EMI. To this end, the elastic bellows is typically of substantially tubular shape, entirely enclosing the second portion of the probe in the space between the probe support and the aperture.

The elastic bellows may also be designed so as to enclose only a part of the second portion of probe in the space between the probe support and the aperture. To this end, the elastic bellows is typically of substantially conical shape, the apex of the cone having an opening which closely surrounds the probe.

Alternatively, the elastic bellows may be designed so as to be a substantially flat, plate-like membrane, having an opening which closely surrounds the probe. In this case, the elastic bellows becomes a part of the wall of the housing and does not enclose the second portion of the probe at all. However, it still enables intrusion of the first portion of the probe into the housing.

The probe station of the invention may further comprise any of the characteristics and features described hereinafter in any combination, without limitation, to improve performance and reduce manufacturing cost.

The elastic bellows can advantageously be pleated, i.e. it may have pleats, wrinkles, folds or other forms of alternating ridges and grooves. This allows for easier compensation of movements of the probe caused by a positioning mechanism.

The elastic bellows is made of an elastic material in order to allow for displacement of the probe and to support compensation of probe movements. For example, the elastic material may be a metal, a silicone graphite compound or a rubber graphite compound. The graphite in such compounds provides for electric conductivity of the bellows which is necessary to confer EMI shielding capability to the bellows.

Alternatively, the elastic bellows may be made of an electrically conductive, e.g. a metal, or an insulating material, e.g. a polymer, which is coated with one or more layers of metal, as for instance Copper or Aluminum. Such coatings can be obtained through several known thin film technologies, as for instance sputtering. Favorably, the metal coating consists of at least two layers of different metals. It is beneficial to cover the metal coating with a protective layer, preferably a layer of elastic material.

The elastic bellows can also be made of a composite material containing an electrically conductive, textile core embedded in an elastic material. In this case, the textile core is favorably a metal plated fabric of synthetic fibers.

Best results in terms of EMI shielding can be achieved if the elastic bellows is electrically connected to the housing and/or the probe or the probe support, respectively.

The foregoing objectives, features and advantages of the invention will be more readily understood upon consideration of the following detailed description of the invention, taken in conjunction with the accompanying drawing.

BRIEF DESCRIPTION OF THE DRAWINGS

The only FIGURE is a sectional front view of the probe station according to the present invention.

DESCRIPTION OF THE PREFERRED EMBODIMENT

With reference to the FIGURE, an exemplary embodiment of the probe station of the present invention comprises a housing 1 having an aperture 5 through which a probe 7 extends. The aperture 5 is arranged in a covering structure 4 covering an opening 3 in a top wall 2 of the housing 1. The probe 7 is supported by a probe support 8 which is arranged in close proximity to the covering structure 4 so that the first portion of the probe 7 extends into the housing 1 through the aperture 5. Inside the housing 1 there is arranged a chuck 6 for supporting a test device (not shown). Two independent positioning mechanisms 10 and 11 enable both the probe 7 and the chuck 6 to move relative to the other.

An electrically conductive elastic bellows 9 extends between the position where it is fixed to the outside portion of the probe 7 and the aperture 5 of the housing 1 such that the elastic bellows 9 is in close contact with the probe 7. The elastic bellows 9 is of substantially conical shape, the apex of the cone having an opening which closely surrounds the probe 7. The elastic bellows 9 encloses the second portion of the probe 7 partially in the space between probe support 8 and aperture 5. The channel thus created shields the enclosed part of the probe 7 from EMI. The first portion of the probe 7, which carries the probe tip, projects through the aperture 5 and into the housing 1, which provides EMI shielding for this portion.

The elastic bellows 9 is made of elastic material and is pleated. This allows for the compensation of movements of the probe 7 caused by a positioning mechanism. In the preferred embodiment, the elastic material of the elastic bellows 9 is metal coated silicone, the metal of the coating being Copper. The metal coating is obtained in a sputtering process and is covered by a protective layer of silicone.

What is claimed is:

1. A probe station comprising:
   (a) a probe;
   (b) a housing having an opening in a top wall of the housing through which the probe extends;
   (c) a covering structure covering the opening and having an aperture through which the probe extends;
   (d) a chuck for supporting a test device, the chuck being arranged inside the housing;
   (e) a probe support for supporting the probe, the probe support being arranged external to the covering structure such that a first portion of the probe extends into the covering structure through said aperture;
   (f) a positioning mechanism enabling at least one of said probe and said chuck to move relative to the other; and
   (g) an electrically conductive, elastic bellows, the elastic bellows being attached to an edge of the aperture and the bellows providing an EMI shielded variable passage for the probe.

2. The probe station of claim 1 wherein the probe is entirely enclosed by the elastic bellows in the space between the probe support and the aperture.

3. The probe station of claim 2 wherein the elastic bellows is of substantially tubular shape, entirely enclosing a second portion of the probe in the space between the probe support and the aperture.

4. The probe station of claim 1 wherein the probe is partially enclosed by the elastic bellows in the space between the probe support and the aperture.

5. The probe station of claim 4 wherein the elastic bellows is of substantially conical shape, an apex of the cone having an opening which closely surrounds the probe.

6. The probe station of claim 1 wherein the elastic bellows is a substantially flat, plate-like membrane, having an opening which closely surrounds the probe.

7. The probe station of claim 1 wherein the elastic bellows is pleated.

8. The probe station of claim 1 wherein a material of the elastic bellows is a metal.

9. The probe station of claim 1 wherein a material of the elastic bellows is a silicone graphite compound.

10. The probe station of claim 1 wherein a material of the elastic bellows is a rubber graphite compound.

11. The probe station of claim 1 wherein the elastic bellows has a metal coating.

12. The probe station of claim 1 wherein the elastic bellows has a metal coating which comprises at least two layers of different metals.

13. The probe station of claim 1 wherein the elastic bellows has a metal coating which is covered by a protective layer of elastic material.

14. The probe station of claim 1 wherein the elastic bellows is made of a composite material containing an electrically conductive, textile core embedded in an elastic material.

15. The probe station of claim 1 wherein the elastic bellows is made of a composite material containing an electrically conductive, textile core embedded in an elastic material and the textile core is a metal plated fabric of synthetic fibers.

16. The probe station of claim 1 wherein the elastic bellows is electrically connected to the housing.

17. The probe station of claim 1 wherein the elastic bellows is electrically connected to the probe.

18. The probe station of claim 1 wherein the elastic bellows is electrically connected to the probe support.

* * * * *